(12) United States Patent
Bußer et al.

(10) Patent No.: US 9,754,635 B2
(45) Date of Patent: Sep. 5, 2017

(54) MOBILE DATA STORAGE DEVICE

(75) Inventors: Jens-Uwe Bußer, München (DE);
Martin Otto, München (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 597 days.

(21) Appl. No.: 12/518,725

(22) PCT Filed: Oct. 15, 2007

(86) PCT No.: PCT/EP2007/060943
§ 371 (c)(1),
(2), (4) Date: Jun. 11, 2009

(87) PCT Pub. No.: WO2008/071478
PCT Pub. Date: Jun. 19, 2008

(65) Prior Publication Data
US 2010/0026105 A1    Feb. 4, 2010

(30) Foreign Application Priority Data
Dec. 11, 2006  (DE) .................. 10 2006 058 352

(51) Int. Cl.
G06K 19/06     (2006.01)
G11C 5/14      (2006.01)
G06K 19/07     (2006.01)
G06K 19/077    (2006.01)

(52) U.S. Cl.
CPC .......... *G11C 5/142* (2013.01); *G06K 19/0702* (2013.01); *G06K 19/077* (2013.01)

(58) Field of Classification Search
USPC .......................................... 235/492; 310/15
See application file for complete search history.

(56) References Cited

U.S. PATENT DOCUMENTS

| 6,411,212 | B1 | 6/2002 | Hecht et al. | |
| 7,333,783 | B2* | 2/2008 | Rode ................... | H02K 7/1853 455/127.1 |
| 2003/0197612 | A1* | 10/2003 | Tanaka et al. ............. | 340/572.1 |

(Continued)

FOREIGN PATENT DOCUMENTS

| DE | 19620880 | 11/1997 |
| DE | 19832628 | 2/2000 |
| EP | 0977145 | 2/2000 |

(Continued)

*Primary Examiner* — Rafferty Kelly
(74) *Attorney, Agent, or Firm* — Slayden Grubert Beard PLLC

(57) ABSTRACT

A mobile data storage device is configured in the manner of a data storage card, or a data storage stick. The mobile data storage device can include at least one electrical coil (7), and energy storage (6), a data storage (1), at least one interface unit (3), and at least one permanent magnet (8). The at least one interface unit (3) is configured for the output or the receiving of data that is stored, or that can be stored, in the data storage (1). The energy storage (6) can be inductively charged by a magnetic alternating field, which can be generated by displacing the at least one permanent magnet (8) in a region of the electrical coil (7). At least one of the at least one interface unit (3) is electrically coupled to the energy storage for the energy supply thereof.

19 Claims, 3 Drawing Sheets

(56) References Cited

U.S. PATENT DOCUMENTS

2006/0139000 A1* 6/2006 Bailey .................. H02J 7/0042
　　　　　　　　　　　　　　　　　　　　　　　320/114
2006/0176153 A1* 8/2006 Tang ........................... 340/10.4

FOREIGN PATENT DOCUMENTS

| EP | 1146476 | 10/2001 |
| WO | WO 0109954 | 2/2001 |
| WO | WO 0115061 | 3/2001 |

* cited by examiner

MOBILE DATA STORAGE DEVICE

CROSS REFERENCE TO RELATED APPLICATIONS

This application is a U.S. National Stage of International Application No. PCT/EP2007/060943, filed Oct. 15, 2007 and claims the benefit thereof. The International Application and this application claims the benefits of German Application No. 10 2006 058 352.3, filed on Dec. 11, 2006, both applications are incorporated by reference herein in their entirety.

BACKGROUND

1. Field of the Invention

The disclosure relates to a mobile data storage device which is embodied as a data storage card or data storage stick.

2. Description of the Related Art

WO 01/09954 A1 discloses an active film for chip cards with display. Optical display elements and electronic control components are embodied by organic semiconductor materials arranged next to one another on a plastic film. A solar cell is also provided as an energy source.

SUMMARY

An aspect of the disclosure is to provide a mobile data storage device which is simple and can be supplied with electrical energy independently of an availability of light.

The disclosure describes a mobile data storage device which is embodied as a data storage card or data storage stick. The mobile data storage device can include at least one electric coil, an energy store, a data store, at least one interface unit and at least one permanent magnet. The at least one interface unit is embodied for outputting or recording data which is or can be stored in the data store. The energy store can be charged inductively by a magnetic alternating field which can be generated by moving the at least one permanent magnet in a region of the electric coil. At least one of the one or more interface units is electrically coupled to the energy store for its power supply.

The advantage is that at least one sub-functionality or one supplementary functionality of the mobile data storage device can also be used when the latter is not coupled to an external and possibly stationary read/write unit by which the mobile data storage device can be supplied as necessary with electrical energy. The required electrical energy can be generated as needed at any time. The resulting independence that this gives from external energy sources means that the mobility aspect is preserved when using the mobile data storage device. Furthermore, no batteries need to be provided and replaced as necessary when they are exhausted. As a result an overall longer service life of the mobile data storage device is possible.

In an advantageous embodiment the at least one permanent magnet is coupled to a slider by which the at least one permanent magnet can be moved in a straight line through or over the at least one electric coil. The advantage is that a mobile data storage device of this kind is simple. The slider is embodied, for example, for manual operation, for sliding the slider back and forth with a finger, for example. However, the slider can also be embodied for example in such a way that the slider and hence also the at least one permanent magnet can be moved back and forth by shaking the mobile data storage device.

In a further advantageous embodiment the at least one permanent magnet is coupled to a drive wheel by which the at least one permanent magnet can be moved in a circular motion over the electric coil or past the latter. The advantage is that a mobile data storage device of this kind is simple. The drive wheel is embodied, for example, to be operated manually, by a rotary knob or by a finger, pencil or other suitable object inserted through the drive wheel, for example.

In a further advantageous embodiment, at least one of the one or more interface units includes an optical or acoustic display which can be powered by energy from the energy store. This enables a supplementary functionality of the mobile data storage device based on the optical or acoustic display. For example, an energy content of the energy store can be displayed or it can be indicated whether the energy content of the energy store is sufficient for the envisaged operation of the mobile data storage device. The optical or acoustic display can also be used for example to indicate a status of a communication, for example a start, an end or an error, or to display a memory content of the data store.

In a further advantageous embodiment, at least one of the one or more interface units includes a transmit and/or receive unit which can be powered by energy from the energy store. With the electrical energy stored in the energy store it is possible to achieve a greater range for the communication of the mobile data storage device via the transmit and/or receive unit.

In a further advantageous embodiment, the at least one electric coil is embodied as planar. This has the advantage that the mobile data storage unit can be embodied as very flat and easy to manufacture. Embodying the at least one electric coil as flat means that the mobile data storage device can be embodied in particular as a chip card or smartcard and in particular as a radio-frequency-identification-based chip card or smartcard without externally accessible electrical contacts.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
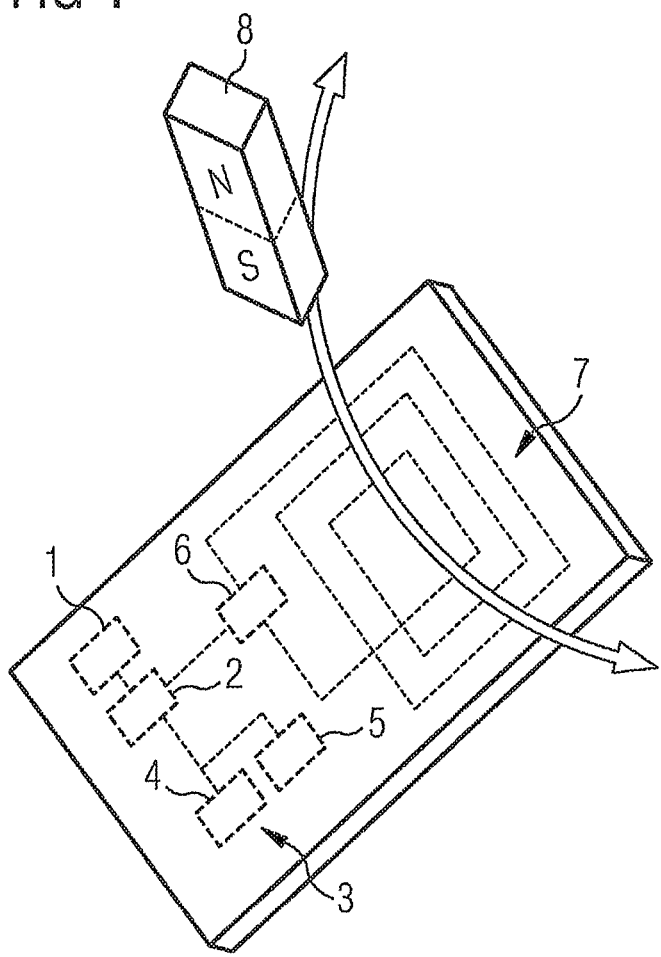
FIG. 1 shows a mobile data storage device.

Reference will now be made in detail to the preferred embodiments, examples of which are illustrated in the accompanying drawings, wherein like reference numerals refer to like elements throughout.

Elements of identical design or function are labeled with the same reference numbers throughout the figures.

A mobile data storage device is embodied as a data storage card or data storage stick. In particular the mobile data storage device is embodied as a chip card or smartcard or as a USB data storage stick. The chip card or smartcard has externally accessible contact surfaces, for example. A read/write unit into which the chip card or smartcard can be inserted is embodied for contacting the contact surfaces and for supplying the mobile data storage device with electrical energy. Furthermore, communication and data exchange between the read/write device and the mobile data storage device take place via the contact surfaces. Alternatively or in addition, however, the mobile data storage device can also be embodied for contactless communication or contactless data exchange by RFID. Electrical energy for powering the mobile data storage device is in this case taken from an electromagnetic alternating field which can be generated by the correspondingly embodied read/write unit.

However, if there is no read/write unit available from which the mobile data storage device can draw electrical energy for its operation, operation of the mobile data storage device is only possible if the device has its own separate energy source. An energy source of this kind can be a battery, an accumulator or a solar cell, for example. The lifetime of a battery is limited, however, and an accumulator must be recharged at regular intervals in order to be able to provide sufficient energy for operation of the mobile data storage device. Sufficient light must be present in order to use a solar cell as an energy source.

An electrogenerator or a dynamo is provided in the mobile data storage device as an energy source that is independent of the charge condition of a battery or an accumulator and of exposure to light. Mechanical energy is converted into electrical energy by the electrogenerator or dynamo.

The mobile data storage device can include a data store 1, a control unit 2 and at least one interface unit 3 (FIG. 1). The at least one interface unit 3 is embodied, for example, as a transmit and/or receive unit 4 and/or as an optical and/or acoustic display 5. Further interface units 3 can also be provided, for example an interface conforming to a Universal Serial Bus (USB for short), or an interface for radio frequency identification (RFID for short), or another interface which can be used for the mobile data storage device.

The mobile data storage device also includes an energy store 6, at least one electric coil 7 and at least one permanent magnet 8. The electric coil 7 is electrically coupled to the energy store 6, for example, via a rectifier (not shown). The energy store 6 is, for example, a capacitor or an accumulator. By moving the at least one permanent magnet 8 over the at least one electric coil 7 it is possible to generate a magnetic alternating field in a region of the at least one electric coil 7. Depending on the magnetic alternating field, the energy store 6 can be charged with electrical energy which can be obtained by induction from the magnetic alternating field.

Figure 2:
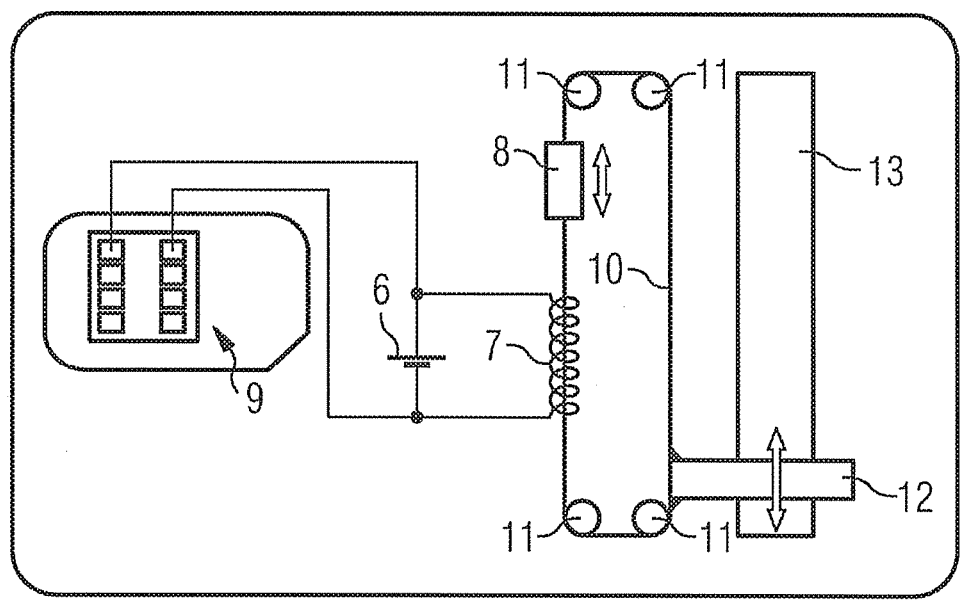
FIG. 2 a first embodiment of the mobile data storage device.

FIG. 2 shows a first embodiment of the mobile data storage device. The data store 1 and the control unit 2 and possibly the at least one interface unit 3 are disposed in a module 9. The module 9 is disposed in a chip card or smartcard, for example. The at least one permanent magnet 8 is connected to a drive belt 10 which is guided via guide pulleys 11 and connected to a slider 12. The permanent magnet 8 can be moved through the at least one electric coil 7 by the drive belt 10. The mobile data storage device preferably has a cutout 13 through which the slider 12 can be accessed. The slider 12 can be slid back and forth manually, for example, thereby pulling the at least one permanent magnet 8 correspondingly through the electric coil 7. The mobile data storage device can, however, also be embodied in such a way that the at least one permanent magnet 8 can be moved through the at least one electric coil 7 by, for example, shaking the mobile data storage device.

Figure 3:
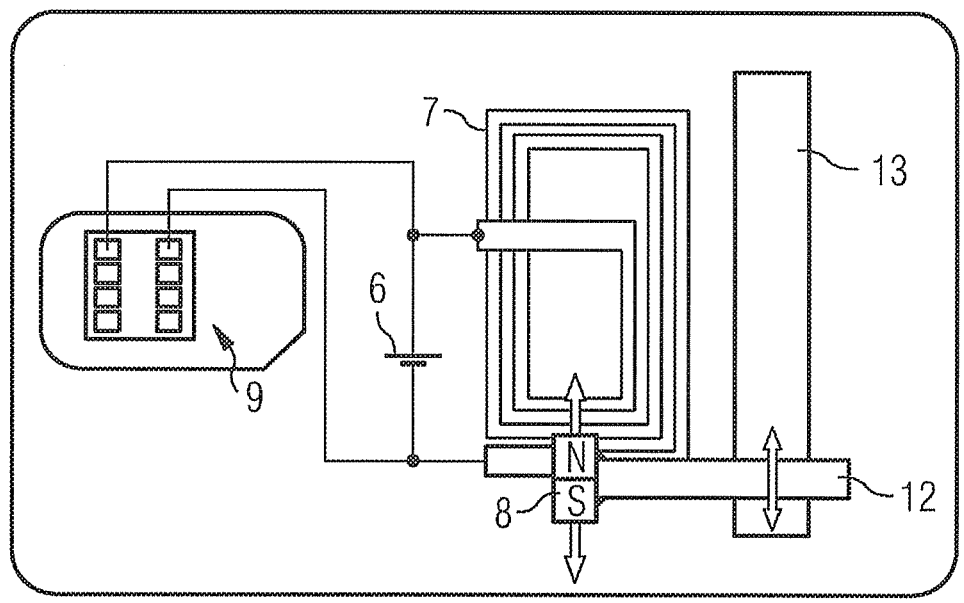
FIG. 3 a second embodiment of the mobile data storage device.

As a second embodiment of the mobile data storage device, FIG. 3 shows a variant of the first embodiment in which the at least one permanent magnet 8 is coupled directly to the slider 12. The electric coil 7 is embodied as planar and can be embodied in one plane or in a plurality of planes. The permanent magnet 8 can be moved over the at least one electric coil 7 by the slider 12. The second embodiment has the advantage that the drive belt 10 and the guide pulleys 11 are not required and furthermore the mobile data storage device can in this way be embodied as particularly flat.

Figure 4:
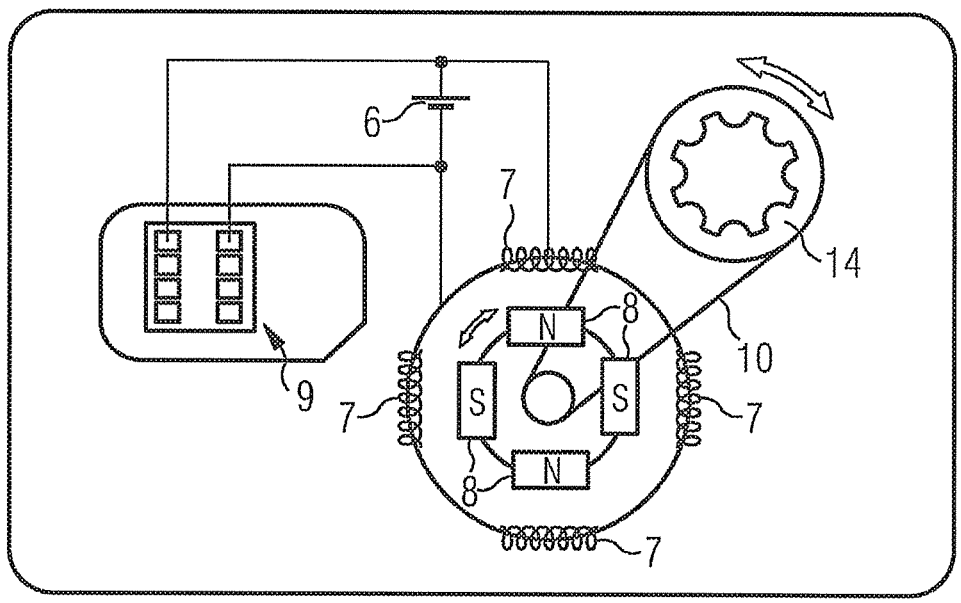
FIG. 4 a third embodiment of the mobile data storage device.

FIG. 4 shows a third embodiment of the mobile data storage device. In the third embodiment of the mobile data storage device the slider 12 is replaced by a drive wheel 14 which moves the at least one permanent magnet 8 via the drive belt 10 in a rotatory motion over the at least one electric coil 7 or past the latter. The electric coil 7 is preferably subdivided into a plurality of coil sections which are arranged electrically in series relative to one another. The coil sections are arranged for example in a circular formation such that the at least one permanent magnet 8 passes all the coil sections in turn in its rotatory movement. The mobile data storage device preferably has a circular cutout through which the drive wheel 14 is accessible from outside the mobile data storage device. The drive wheel 14 is preferably embodied such that a pencil, for example, can be inserted into the drive wheel 14 and the drive wheel 14 can be driven by rotating the mobile data storage device around the pencil or by turning the pencil. This is equivalent to winding up a magnetic tape in a compact audio cassette with the aid of a pencil. Instead of the pencil, another suitable object or a finger can also be used where appropriate. However, a rotary knob or crank handle can also be provided which is coupled to the drive wheel 14 or incorporates the latter.

Figure 5:
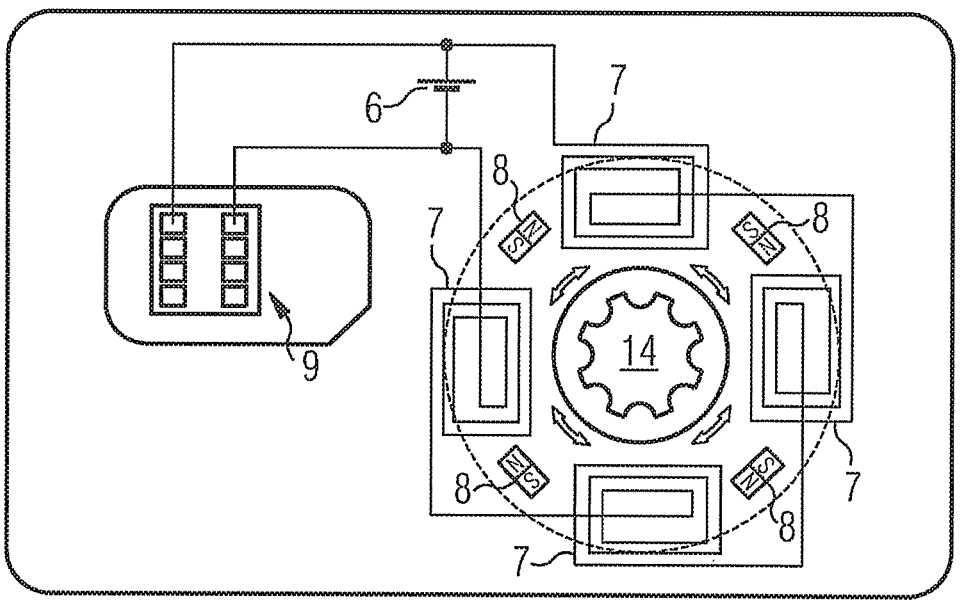
FIG. 5 a fourth embodiment of the mobile data storage device.

As a fourth embodiment of the mobile data storage device FIG. 5 shows a variant of the third embodiment. The at least one electric coil 7 with its coil sections is embodied as planar. The drive wheel 14 is disposed in such a way that the coil sections of the electric coil 7 encircle the drive wheel 14. The at least one permanent magnet 8 is coupled to the drive wheel 14. For example, the at least one permanent magnet 8 is disposed on a disk in the center of which the drive wheel 14 is disposed and which is coupled to the latter. The fourth embodiment has the advantage that it can be embodied as particularly flat and furthermore can be manufactured with few components.

Supplying power to the mobile data storage device by an electrogenerator or a dynamo is advantageous in particular when the mobile data storage device includes a processor which is incorporated or formed by the control unit 2, for example, and the processor can be powered by the generated energy. This enables a supplementary functionality of the mobile data storage device to be used in a mobile manner and independently of the availability of an external read/write unit. The supplementary functionality includes, for example, a displaying of information.

The optical and/or acoustic display 5 is embodied for example for displaying an amount of energy that is available in the energy store 6 and/or for indicating whether the available amount of energy is sufficient for operation of the mobile data storage device. Furthermore the optical and/or acoustic display 5 can be embodied for displaying a memory content of the data store 1 and/or for indicating a status of a communication process, for example a start or an end of the communication process or possibly the occurrence of a communication error.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. A mobile data storage device embodied as a data storage card or data storage stick and comprising:
    a housing;
    at least one electric coil arranged in the housing;
    an energy store arranged in the housing and coupled to the coil;
    a data store arranged in the housing;
    at least one interface unit arranged in the housing and coupled to the data store and the energy store, the at least one interface unit configured for communicating data to or from the data store; and
    at least one permanent magnet arranged in the housing,
    an opening in the housing; and
    a manually moveable control element mechanically coupled to the at least one permanent magnet, the manually moveable control element being manually accessible via the opening in the housing;
    wherein manual movement of the control element via the opening in the housing moves the at least one permanent magnet relative to the electric coil in a region determined to generate a magnetic alternating field, thereby inductively charging the energy store.

2. The mobile data storage device as claimed in claim 1, wherein the at least one permanent magnet is coupled to a slider by which the at least one permanent magnet can be moved in a straight line through or over the electric coil.

3. The mobile data storage device as claimed in claim 1, wherein the at least one permanent magnet is coupled to a drive wheel by which the at least one permanent magnet can be moved in a circular motion over or past the electric coil.

4. The mobile data storage device as claimed in claim 1, wherein the at least one interface unit includes an optical or acoustic display which can be powered by energy from the energy store.

5. The mobile data storage device as claimed in claim 1, wherein the at least one interface unit includes a transmit and/or receive unit which can be powered by energy from the energy store.

6. The mobile data storage device as claimed in claim 1, wherein the at least one electric coil is embodied as planar.

7. The mobile data storage device as claimed in claim 1, wherein the manually moveable control element extends through the opening in the housing.

8. The mobile data storage device as claimed in claim 1, wherein the manually moveable control element comprises a sliding element extending through the opening in the housing.

9. The mobile data storage device as claimed in claim 1, wherein the manually moveable control element comprises a drive wheel rotatably fixed to the housing for rotation about a single fixed axis, wherein a manual rotation of the drive wheel causes a corresponding rotational movement of the at least one permanent magnet.

10. The mobile data storage device as claimed in claim 9, wherein the manual rotation of the drive wheel causes a corresponding rotational movement of the at least one permanent magnet about the same fixed axis of rotation of the drive wheel.

11. The mobile data storage device as claimed in claim 9, wherein the manual rotation of the drive wheel causes a corresponding rotational movement of the at least one permanent magnet about the a fixed axis of rotation parallel to and offset from the fixed axis of rotation of the drive wheel.

12. A mobile data storage system, comprising:
    a data storage card or data storage stick, comprising:
        a device housing including an opening;
        an electric coil arranged in the device housing, wherein the electric coil is planar and extends in a first plane;
        an energy store arranged in the device housing and coupled to the coil;
        a data store arranged in the device housing and configured to store data;
        an interface unit arranged in the device housing, the interface unit being coupled to the data store, coupled to the energy store to be powered by the energy store arranged in the device housing, and configured for communicating data to or from the data store;
        a magnet guide;
        a permanent magnet arranged in the device housing and movably coupled to the magnet guide for guided movement of the permanent magnet in a second plane parallel to the first plane of the electric coil; and
        a manually moveable control element that is manually accessible via the opening in the housing, the manually moveable control element being coupled to the permanent magnet and manually movable to effect the guided movement of the permanent magnet in the second plane parallel to the first plane of the electric coil to thereby inductively charge the energy store.

13. The mobile data storage system of claim 12, wherein the manually moveable control element extends through the opening in the device housing.

14. The mobile data storage system of claim 12, wherein the permanent magnet is configured for rotatable movement relative to the electric coil.

15. The mobile data storage system of claim 12, wherein the permanent magnet is configured for linear movement relative to the electric coil.

16. The mobile data storage system of claim 12, wherein the interface unit includes an optical or acoustic display configured to be powered by energy from the energy store.

17. The mobile data storage system of claim 12, wherein the interface unit includes at least one of a transmit unit or a receive unit configured to be powered by energy from the energy store.

18. A mobile data storage system, comprising:
    a data storage card or data storage stick, comprising:
        a device housing;
        an electric coil arranged in the device housing, wherein the electric coil is planar and extends in a first plane;
        an energy store arranged in the device housing and coupled to the coil;
        a data store arranged in the device housing;
        an interface unit arranged in the device housing and coupled to the data store and the energy store and configured for communicating data to or from the data store;
        a magnet guide;
        a permanent magnet arranged in the device housing and movably coupled to the magnet guide for guided movement of the permanent magnet in a second plane parallel to the first plane of the electric coil;

a manually moveable control element coupled to the permanent magnet and selectively movable independent of the device housing, wherein a manual movement of the control element, independent of the device housing, effects a guided movement of the permanent magnet in the second plane parallel to the first plane of the electric coil to thereby inductively charge the energy store.

19. The mobile data storage system of claim 18, wherein:

the device housing includes an opening; and the manually moveable control element is manually accessible via the opening in the device housing.

\* \* \* \* \*